United States Patent
Emoto

(10) Patent No.: US 12,319,859 B2
(45) Date of Patent: Jun. 3, 2025

(54) PHOSPHOR, WAVELENGTH CONVERSION BODY, AND LIGHT EMITTING DEVICE

(71) Applicant: DENKA COMPANY LIMITED, Tokyo (JP)

(72) Inventor: Hideyuki Emoto, Tokyo (JP)

(73) Assignee: DENKA COMPANY LIMITED, Tokyo (JP)

( * ) Notice: Subject to any disclaimer, the term of this patent is extended or adjusted under 35 U.S.C. 154(b) by 338 days.

(21) Appl. No.: 18/012,053

(22) PCT Filed: Jun. 17, 2021

(86) PCT No.: PCT/JP2021/023010
§ 371 (c)(1),
(2) Date: Dec. 21, 2022

(87) PCT Pub. No.: WO2022/004406
PCT Pub. Date: Jan. 6, 2022

(65) Prior Publication Data
US 2023/0242814 A1    Aug. 3, 2023

(30) Foreign Application Priority Data

Jul. 3, 2020  (JP) ................. 2020-115728
Jul. 3, 2020  (JP) ................. 2020-115729
Jul. 3, 2020  (JP) ................. 2020-115732

(51) Int. Cl.
C09K 11/77    (2006.01)
H10H 20/851   (2025.01)

(52) U.S. Cl.
CPC ... C09K 11/77348 (2021.01); H10H 20/8512 (2025.01)

(58) Field of Classification Search
CPC ............... C09K 11/77348; H10H 20/8512
See application file for complete search history.

(56) References Cited

U.S. PATENT DOCUMENTS

| | | | |
|---|---|---|---|
| 9,534,171 B2 | 1/2017 | Hirosaki et al. |
| 9,617,471 B2 | 4/2017 | Hirosaki et al. |
| 9,828,547 B2 | 11/2017 | Hirosaki et al. |
| 2015/0146408 A1 | 5/2015 | Hirosaki et al. |
| 2016/0060518 A1 | 3/2016 | Hirosaki et al. |
| 2016/0096991 A1 | 4/2016 | Hirosaki et al. |

FOREIGN PATENT DOCUMENTS

| | | |
|---|---|---|
| JP | 2007-189254 A | 7/2007 |
| JP | 2018-070736 A | 5/2018 |
| JP | 2019-210367 A | 12/2019 |
| WO | 2014/003076 A1 | 1/2014 |
| WO | 2014/175385 A1 | 10/2014 |
| WO | 2014/185415 A1 | 11/2014 |

OTHER PUBLICATIONS

Takeda et al, "Powder synthesis and luminescence propeties of green emitting Ba2LiSi7—xAlxN12—xOx:Eu2+ phosphor", Journal of Alloys and Compounds, 850, (2021), 156358, pp. 1-8, Aug. 7, 2020.*
Takeda et al, "Naroow-Band Green-Emitting Phosphor Ba2LiSi7Al:Eu2+ with High Thermal Stability Discovered by a Single Particle DSiagnosis Approach", Chem. Mater. 2017, 27, pp. 5892-5898, Jul. 20, 2015.*
Sep. 25, 2024, Office Action issued in Korean Patent Application No. 10-2003-7000046.*
Sep. 18, 2024 Office Action issued in Taiwanese Patent Application No. 110123242.
Takeda et al.; "Narrow-Band Green-Emitting Phosphor Ba2LiSi7AlN12:Eu2+ with High Thermal Stability Discovered by a Single Particle Diagnosis Approach"; Chemistry of Materials; vol. 27; 2015; pp. 5892-5898.
Aug. 17, 2021 Search Report issued in International Patent Application No. PCT/JP2021/023010.
"Physical Chemistry of Ceramics," Nanjing University of Chemical Technology, South China Institute of Technology, an Tsinghua University (ed.), 1981, p. 19.
Chung-Kuk et al., "Principles, Technologies, and Applications and Photovoltaic Power Generation," 2020, pp. 54-55.
Apr. 16, 2024 Office Action issued in Chinese Patent Application No. 202180047683.4.

* cited by examiner

Primary Examiner — C Melissa Koslow
(74) Attorney, Agent, or Firm — Oliff PLC

(57) ABSTRACT

A phosphor of the present invention is a phosphor containing an inorganic compound in which Eu as an activator is solid-soluted in an inorganic crystal having a crystal represented by $LiBa_2AlSi_7N_{12}$ or the same crystal structure as the crystal represented by $LiBa_2AlSi_7N_{12}$, in which in an X-ray diffraction pattern of the phosphor measured using a Cu-Kα ray, $I_1$ and $I_2$ satisfy $0<I_2/I_1 \leq 0.050$ when a peak maximum intensity of a peak which is present at a position where a diffraction angle $2\theta$ is in a range of 31.3° or more and 31.6° or less is $I_1$, and a peak maximum intensity of a peak which is present at a position where a diffraction angle $2\theta$ is in a range of 29.8° or more and 30.6° or less is $I_2$.

15 Claims, No Drawings

PHOSPHOR, WAVELENGTH CONVERSION BODY, AND LIGHT EMITTING DEVICE

TECHNICAL FIELD

The present invention relates to a phosphor, a wavelength conversion body, and a light emitting device.

BACKGROUND ART

Various developments have been made on $LiBa_2AlSi_7N_{12}$-based phosphors so far. As this type of technique, a technique disclosed in Patent Document 1 is known, for example. Patent Document 1 discloses an $LiBa_2AlSi_7N_{12}$-based phosphor as a chemically and thermally stable phosphor having high luminescence intensity even when being combined with an LED of 470 nm or less (paragraph 200 of Patent Document 1).

RELATED DOCUMENT

Patent Document

[Patent Document 1] International Publication No. WO2014/003076

SUMMARY OF THE INVENTION

Technical Problem

However, as a result of the examination by the inventor of the present invention, it became clear that there is room for improvement in luminescence characteristics in the $LiBa_2AlSi_7N_{12}$-based phosphor disclosed in Patent Document 1.

Solution to Problem

As shown in Table 6 of Patent Document 1, various types of subphases are also generated along with a main phase at the time of firing in the manufacturing process of the $LiBa_2AlSi_7N_{12}$-based phosphor. Depending on composition components, there is a concern that the subphase degrades the luminescence characteristics of the $LiBa_2AlSi_7N_{12}$-based phosphor.

As a result of further examination, the inventor of the present invention found a heterophase not disclosed in Patent Document 1 regarding the $LiBa_2AlSi_7N_{12}$-based phosphor, and found that the luminescence characteristics of the phosphor were enhanced by appropriately controlling the abundance ratio of the heterophase to the main phase.

As a result of further intensive research based on such findings, it was found that, when a peak maximum intensity of a peak which is present at a position where a diffraction angle 2θ is in a range of 31.3° or more and 31.6° or less is $I_1$, and a peak maximum intensity of a peak which is present at a position where a diffraction angle 2θ is in a range of 29.8° or more and 30.6° or less is $I_2$ in an X-ray diffraction pattern of a phosphor measured using a Cu-Kα ray, the luminescence characteristics of the phosphor can be stably evaluated by using $I_2/I_1$ as an index as the abundance ratio of such a specific heterophase, and the phosphor having excellent luminescence characteristics can be embodied by setting $I_2/I_1$ to a predetermined value or less, and thereby the present invention was completed.

According to the present invention,
a phosphor is provided, the phosphor containing an inorganic compound in which Eu as an activator is solid-soluted in an inorganic crystal having a crystal represented by $LiBa_2AlSi_7N_{12}$ or the same crystal structure as the crystal represented by $LiBa_2AlSi_7N_{12}$,
in which, in an X-ray diffraction pattern of the phosphor measured using a Cu-Kα ray, when a peak maximum intensity of a peak which is present at a position where a diffraction angle 2θ is in a range of 31.3° or more and 31.6° or less is $I_1$, and a peak maximum intensity of a peak which is present at a position where a diffraction angle 2θ is in a range of 29.8° or more and 30.6° or less is $I_2$,
$I_1$ and $I_2$ satisfy $0<I_2/I_1 \leq 0.050$.

According to the present invention, a wavelength conversion body containing the above-mentioned phosphor is further provided.

According to the present invention, a light emitting device including the above-mentioned wavelength conversion body is still further provided.

Advantageous Effects of Invention

According to the present invention, a phosphor having excellent luminescence characteristics, a wavelength conversion body formed using the same, and a light emitting device are provided.

DESCRIPTION OF EMBODIMENTS

A phosphor of the present embodiment will be outlined.
The phosphor contains an inorganic compound in which Eu as an activator is solid-soluted in an inorganic crystal having a crystal represented by $LiBa_2AlSi_7N_{12}$ or the same crystal structure as the crystal represented by $LiBa_2AlSi_7N_{12}$.

This phosphor is constituted such that in an X-ray diffraction pattern using a Cu-Kα ray, $I_1$ and $I_2$ satisfy $0<I_2/I_1 \leq 0.050$ when a peak maximum intensity of a peak which is present at a position where a diffraction angle 2θ is in a range of 31.3° or more and 31.6° or less is $I_1$, and a peak maximum intensity of a peak which is present at a position where a diffraction angle 2θ is in a range of 29.8° or more and 30.6° or less is $I_2$.

According to the findings of the inventor of the present invention, the luminescence characteristics of the phosphor can be stably evaluated by using $I_2/I_1$ as an index when a peak maximum intensity of a peak which is present at a position where a diffraction angle 2θ is in a range of 31.3° or more and 31.6° or less is $I_1$, and a peak maximum intensity of a peak which is present at a position where a diffraction angle 2θ is in a range of 29.8° or more and 30.6° or less is $I_2$. Furthermore, it became clear that the luminescence characteristics of the phosphor can be enhanced by setting the index $I_2/I_1$ thus found to be equal to or less than the above-mentioned upper limit value.

In the phosphor of the present embodiment, the maximum peak in which the diffraction angle 2θ is in the range of 31.3° or more and 31.6° or less is defined as the peak derived from $LiBa_2AlSi_7N_{12}$ which is the main phase in the phosphor.

The peak in which the diffraction angles 2θ is in the range of 29.8° or more and 30.6° or less includes a peak attributed to $BaAlSi_5N_7O_2$ which is the heterophase in the phosphor.

The luminescence characteristics of the phosphor can be enhanced by appropriately controlling the abundance ratio of the specific heterophase to the main phase.

In addition, an example of the phosphor of the present embodiment may be constituted such that the diffuse reflectance for light having the wavelength of 600 nm is 92.0% or more.

According to the findings of the inventor of the present invention, it was found that the degree of content of a specific heterophase can be stably evaluated by using the 600 nm diffuse reflectance as an index. Furthermore, it became clear that the luminescence characteristics of the phosphor can be enhanced by setting the 600 nm diffuse reflectance which is the index found in this manner to be equal to or more than the above-mentioned lower limit value.

In the phosphor, the lower limit of the diffuse reflectance for light having the wavelength of 600 nm is equal to or more than 92.0%, preferably equal to or more than 92.5%, and more preferably equal to or more than 93.0%, for example. This makes it possible to enhance the luminescence characteristics of the phosphor. On the other hand, the upper limit of the diffuse reflectance for light having the wavelength of 600 nm is not particularly limited, but may be equal to or less than 99.9%.

In the phosphor, the lower limit of the diffuse reflectance for light having the wavelength of 500 nm is equal to or more than 80.0%, preferably equal to or more than 81.0%, and more preferably equal to or more than 84.5%, for example. This makes it possible to enhance the luminescence characteristics of the phosphor. On the other hand, the upper limit of the diffuse reflectance for light having the wavelength of 500 nm is not particularly limited, but may be equal to or less than 99.5%.

In addition, one example of the phosphor of the present embodiment may be constituted such that a y value of color purity of an emission color satisfies $0.575 \leq y \leq 0.590$ in a CIE-xy chromaticity diagram when the phosphor is irradiated with excitation light having the wavelength of 405 nm.

According to the findings of the inventor of the present invention, it was found that the degree of content of a specific heterophase can be stably evaluated by using the y value in the CIE-xy chromaticity diagram as an index. Furthermore, it became clear that the luminescence characteristics of the phosphor can be enhanced by setting the y value in the CIE-xy chromaticity diagram which is found in this manner to be equal to or more than the above-mentioned lower limit value.

When the phosphor is irradiated with excitation light having the wavelength of 405 nm, the y value of color purity of an emission color in the CIE-xy chromaticity diagram satisfies $0.575 \leq y \leq 0.590$, preferably $0.578 \leq y \leq 0.590$, and more preferably $0.580 \leq y \leq 0.588$, for example. By setting the y value to be in such a range, the luminescence characteristics of the phosphor can be enhanced.

Furthermore, when the phosphor is irradiated with excitation light having the wavelength of 405 nm, an x value of color purity of an emission color in the CIE-xy chromaticity diagram satisfies $0.240 \leq x \leq 0.260$, preferably $0.242 \leq x \leq 0.258$, and more preferably $0.245 \leq x \leq 0.255$, for example. By setting the x value to be in such a range, the luminescence characteristics of the phosphor can be enhanced.

In the present embodiment, the above-mentioned peak intensity ratio $I_2/I_1$, the diffuse reflectance for light having the wavelength of 600 nm, the diffuse reflectance for light having the wavelength of 500 nm, and the y value and the x value in the CIE-xy chromaticity diagram can be controlled by appropriately selecting the type and the blending amount of each component contained in the phosphor, the preparation method of the phosphor, and the like, for example. Among these, examples of elements for setting the above-mentioned peak intensity ratio $I_2/I_1$, the diffuse reflectance for light having the wavelength of 600 nm, the diffuse reflectance for light having the wavelength of 500 nm, and the y value and the x value in the CIE-xy chromaticity diagram in desired numerical value ranges include use of aluminum nitride or silicon nitride, which has a relatively small impurity oxygen amount, as the raw material of the phosphor, and use of a container of high-melting-point metals such as molybdenum, tantalum, and tungsten as a firing container.

Although the detailed mechanism is not clear, it is thought that the generation amount of subphases (by-products) such as $BaAlSi_5N_7O_2$ generated in the phosphor can be suppressed by reducing the oxygen amount contained in the raw material component of the phosphor, and by preventing the reaction with the firing container at the time of firing the phosphor.

According to the present embodiment, it is possible to provide a blue-green light emitting phosphor that is efficiently excited by light having the wavelength equal to or more than 250 nm and equal to or less than 480 nm, and has the light emission peak wavelength at the wavelength equal to or more than 500 nm and equal to or less than 530 nm.

A wavelength conversion body including the phosphor of the present embodiment is configured of a member that converts radiated light (excitation light) and emits light having the light emission peak in the wavelength range different from that of the excitation light. This wavelength conversion body may emit light having the light emission peak in the wavelength range of 500 nm or more and 530 nm or less, for example.

The wavelength conversion body may be configured only of the phosphor, or may include a base material in which the phosphor has been dispersed. As the base material, known materials can be used, and examples thereof include glass, resins, and inorganic materials. The wavelength conversion body may contain one or two or more known phosphors other than the phosphor of the present embodiment.

A light emitting device including the phosphor of the present embodiment includes the wavelength conversion body.

Examples of such a light emitting device include a light emitting element, and a wavelength conversion body containing a phosphor that converts light radiated from a light emitting element to emit light. The shape of such a wavelength conversion body is not particularly limited, but the wavelength conversion body may be configured in a plate shape, and may be configured to seal a part of the light emitting element or the entire light emitting surface, for example.

Examples of the light emitting device include LED elements combined with blue light emitting diodes, ultraviolet ray emitting diodes, or the like, light source devices such as backlights for liquid crystal TVs and projectors, image display devices, lighting devices, and signal devices.

The phosphor of the present embodiment will be described in detail below.

The phosphor contains an inorganic compound in which Eu as an activator is solid-soluted in an inorganic crystal having a crystal represented by $LiBa_2AlSi_7N_{12}$ or the same crystal structure as the crystal represented by $LiBa_2AlSi_7N_{12}$. The phosphor may be composed only of an inorganic compound, or may contain a part of this inorganic compound.

This inorganic compound may constitute the base material in the phosphor. In this case, the content of the inorganic compound in the phosphor is equal to or more than 50%, preferably equal to or more than 80%, and more preferably equal to or more than 90% in terms of weight, for example.

The $LiBa_2AlSi_7N_{12}$-based crystal is an orthorhombic crystal and has symmetry of a space group Pnnm.

Furthermore, in the $LiBa_2AlSi_7N_{12}$-based crystal, the lattice constants a, b, and c are preferably values in the range of a=1.409±0.05 nm, b=0.489±0.05 nm, and c=0.806±0.05 nm. By setting the value in such a range, the phosphor having excellent luminescence characteristics can be embodied.

The phosphor is represented by Composition Formula $Ba_aLi_bEu_cSi_dAl_eN_xO_y$, and the phosphor may be represented by a composition in a range in which composition ratios a, b, c, d, e, x, and y in the formula satisfy the following conditions.

$a+b+c+d+e+x+y=1$, $0.05 \leq a \leq 0.1$, $0.025 \leq b \leq 0.08$, $0.00001 \leq c \leq 0.05$, $0.2 \leq d \leq 0.4$, $0.03 \leq e \leq 0.1$, $0.45 \leq x \leq 0.6$, and $0.002 \leq y \leq 0.03$.

By having such a composition, the phosphor having excellent luminescence characteristics can be embodied.

When irradiated with excitation light having the wavelength of 405 nm, the phosphor has the light emission peak in the wavelength range of 500 nm or more and 530 nm or less, preferably 505 nm or more and 525 nm or less, and more preferably 510 nm or more and 520 nm or less in the fluorescence spectrum.

When irradiated with excitation light having the wavelength of 405 nm, the half-width of the light emission peak is equal to or more than 50 nm and equal to or less than 80 nm, preferably equal to or more than 60 nm and equal to or less than 75 nm, and more preferably equal to or more than 68 nm and equal to or less than 71 nm, for example, in the fluorescence spectrum of the phosphor. By setting the half-width in the above-mentioned range, the luminescence intensity can be improved.

In the phosphor, the absorptance for light having the wavelength of 405 nm is equal to or more than 75%, preferably equal to or more than 85%, and more preferably equal to or more than 87%, for example. This increases the luminous efficacy of the phosphor.

In the phosphor, the absorptance for light having the wavelength of 600 nm is equal to or less than 10.0%, preferably equal to or less than 9.5%, and more preferably equal to or less than 9.0%, for example. This increases the luminous efficacy of the phosphor.

In the phosphor, the absorptance for light having the wavelength of 700 nm is equal to or less than 7.0%, preferably equal to or less than 6.5%, and more preferably equal to or less than 6.0%, for example. This increases the luminous efficacy of the phosphor.

The oxygen amount in the phosphor is equal to or less than 3.0% by weight, preferably equal to or less than 2.0% by weight, and more preferably equal to or less than 1.1% by weight, for example. This further enhances the luminescence characteristics of the phosphor.

A method for manufacturing the phosphor of the present embodiment will be described below.

An example of a method for manufacturing the phosphor may include a mixing step of obtaining a raw material mixture containing each element constituting a composition of an inorganic compound in which Eu as an activator is solid-soluted in a crystal represented by an $LiBa_2AlSi_7N_{12}$-based crystal having the crystal structure represented by $LiBa_2AlSi_7N_{12}$, and a firing step of firing the raw material mixture.

Examples of the raw material containing an Li element include a single substance, a mixture of two or more types, or the like containing Li and selected from metals, silicides, oxides, carbonates, nitrides, oxynitrides, chlorides, fluorides, and oxyfluorides.

Examples of the raw material containing a Ba element include a single substance, a mixture of two or more types, or the like containing Ba and selected from metals, silicides, oxides, carbonates, nitrides, oxynitrides, chlorides, fluorides, and oxyfluorides.

Examples of the raw material containing an Al element include a single substance, a mixture of two or more types, or the like containing Al and selected from metals, silicides, oxides, carbonates, nitrides, oxynitrides, chlorides, fluorides, and oxyfluorides.

As the raw material containing an Si element, a single substance, a mixture of two or more types, or the like containing Si and selected from metals, oxides, nitrides, and oxynitrides is used.

As the raw material containing an Eu element, a single substance, a mixture of two or more types, or the like containing Eu and selected from metals, silicides, oxides, carbonates, nitrides, oxynitrides, chlorides, fluorides, and oxyfluorides is used.

Because a part of Ba in the crystal can be replaced with Sr, carbonates, oxides, nitrides, carbides, hydrides, halides, silicides, metals, and the like containing an Sr element can also be used as the raw material mixture.

As the raw material mixture, one containing an Li nitride, a Ba nitride, an Al nitride, an Si nitride, an Eu nitride, or an oxide may be used. Accordingly, the reaction at the time of firing can be promoted.

A method of mixing the raw materials is not particularly limited, but examples thereof include a method of sufficiently mixing using a mixing device such as a mortar, a ball mill, a V-type mixer, a planetary mill, or the like.

In the firing step, the raw material mixture described above may be fired in a firing furnace such as an electric furnace, for example.

Nitrogen gas is preferable as the firing atmosphere.

The firing temperature in the firing step is selected in an appropriate temperature range from the viewpoint of reducing unreacted raw materials after the completion of the firing step and preventing decomposition of the main component.

The lower limit of the firing temperature in the firing step is preferably equal to or higher than 1500° C., more preferably equal to or higher than 1600° C., and further preferably equal to or higher than 1700° C. On the other hand, the upper limit of the firing temperature is preferably equal to or lower than 2200° C., more preferably equal to or lower than 2000° C., and further preferably equal to or lower than 1900° C.

The pressure of the firing atmosphere gas is selected according to the firing temperature, but a pressurization state in the range of 0.1 MPa or more and 10 MPa or less is usually used. When considering industrial productivity, the pressure is preferably equal to or more than 0.5 MPa and equal to or less than 1 MPa.

The firing time in the firing step is selected in an appropriate time range from the viewpoint of reducing unreacted products and improving productivity.

The lower limit of the firing time is preferably equal to or longer than 0.5 hours, and more preferably equal to or longer than 1 hour. In addition, the upper limit of the firing time is preferably equal to or shorter than 48 hours, more preferably equal to or shorter than 24 hours, and further preferably equal to or shorter than 16 hours.

As described above, a reaction product (fired product) after the firing step is obtained.

The method for manufacturing the phosphor according to the present embodiment may further include a pulverization step of pulverizing the reaction product (fired product) after the firing step to obtain a pulverized product.

The state of the fired product obtained by the firing step varies from powdery to bulky depending on the blending of raw materials and the firing conditions. By the crushing and pulverization step and/or a classification operation step, the fired product can be made into a powder of a predetermined size.

In addition to the above-mentioned steps, a step known in the field of phosphors may be added.

Regarding the powdery phosphor, the particle size at which the cumulative value is 50% is defined as D50, the particle size at which the cumulative value is 10% is defined as D10, and the particle size at which the cumulative value is 90% is defined as D90 in a volume frequency particle size distribution measured using a laser diffraction scattering method.

D50 is equal to or more than 1 µm and equal to or less than 30 µm, preferably equal to or more than 5 µm and equal to or less than 25 µm, and more preferably equal to or more than 10 µm and equal to or less than 20 µm, for example. In the above-mentioned range, a balance in luminescence characteristics can be achieved.

The lower limit of ((D90−D10)/D50) is equal to or more than 1.00, preferably equal to or more than 1.20, and more preferably equal to or more than 1.30, for example. On the other hand, the upper limit of ((D90−D10)/D50) is equal to or less than 5.00, preferably equal to or less than 2.00, and more preferably equal to or less than 1.80. In the above-mentioned range, a balance in luminescence characteristics can be achieved.

Although the embodiments of the present invention have been described above, these are examples of the present invention, and various configurations other than the above can be adopted. Furthermore, the present invention is not limited to the above-mentioned embodiments, and modifications, improvements, and the like within the scope capable of achieving the object of the present invention are included in the present invention.

EXAMPLES

Hereinafter, the present invention will be described in detail with reference to examples, but the present invention is not limited to the description of these examples.

Example 1

(Manufacture of Phosphor)

According to the blending ratio of the raw material mixture shown in Table 1, lithium nitride ($Li_3N$, manufactured by Materion Corporation), barium nitride ($Ba_2N$, manufactured by TAIHEIYO CEMENT CORPORATION), aluminum nitride having the impurity oxygen amount of 0.8% by weight (AlN, manufactured by Tokuyama Corporation, grade E), silicon nitride having the impurity oxygen amount of 1.2 wt % ($Si_3N_4$, manufactured by UBE INDUSTRIES, LTD., grade E10), and europium oxide ($Eu_2O_3$, manufactured by Shin-Etsu Chemical Co., Ltd., grade RU) were weighed to perform mixing for 5 minutes in a glove box in a nitrogen atmosphere using an agate pestle and mortar, thereby obtaining a powdery raw material mixture.

Subsequently, the raw material mixture was put in a tantalum crucible.

The crucible containing the raw material mixture was put in a graphite resistance heating type electric furnace, the firing atmosphere was set to a vacuum equal to or less than $1\times10^{-1}$ Pa with an oil rotary pump and an oil diffusion pump, heating was performed from room temperature to 600° C. at the rate of 500° C. per hour, nitrogen with the purity of 99.999% by volume was introduced at 600° C. to set the pressure in the furnace to 0.9 MPa, and the temperature was raised to 1800° C. at 300° C. per hour to perform firing for 8 hours.

The obtained fired product was pulverized in a mortar and then sieved (classification-treated) with a sieve having the aperture of 45 µm. The powder that had passed through the sieve was recovered to obtain a powdery phosphor (phosphor particles).

Example 2

A powdery phosphor (phosphor particles) was obtained in the same manner as in Example 1 except that one, which was obtained by heat-treating $Si_3N_4$ (manufactured by UBE INDUSTRIES, LTD., grade E10) as silicon nitride in a nitrogen atmosphere under conditions of 2000° C. for 8 hours to reduce the impurity oxygen amount to 0.4% by weight, was used according to the blending ratio of the raw material mixture shown in Table 1.

Example 3

A powdery phosphor (phosphor particles) was obtained in the same manner as in Example 1 except that $Ba_3N_2$ (manufactured by Materion Corporation) was used as barium nitride according to the blending ratio of the raw material mixture shown in Table 1.

Comparative Example 1

A powdery phosphor (phosphor particles) was obtained in the same manner as in Example 1 except that $Al_2O_3$ (manufactured by TAIMEI CHEMICALS CO., LTD., grade TM-DAR) was partially used as the aluminum source in addition to aluminum nitride according to the blending ratio of the raw material mixture shown in Table 1.

Comparative Example 2

A powdery phosphor (phosphor particles) was obtained in the same manner as in Example 1 except that a crucible made of a boron nitride sintered body was used according to the blending ratio of the raw material mixture shown in Table 1.

TABLE 1

| Blending composition | Unit | Example 1 | Comparative Example 1 | Example 2 | Example 3 | Comparative Example 2 |
|---|---|---|---|---|---|---|
| $Ba_2N$ | wt % | 39.28 | 39.07 | 39.28 | | |
| $Ba_3N_2$ | | | | | 39.67 | 39.67 |
| $Li_3N$ | | 2.49 | 2.48 | 2.49 | 2.48 | 2.48 |
| $Eu_2O_3$ | | 2.52 | 2.51 | 2.52 | 2.50 | 2.50 |
| $Si_3N_4$ | | 46.90 | 46.65 | | 46.60 | 46.60 |
| $Si_3N_4$ (heated) | | | | 46.90 | | |
| AlN | | 8.81 | 6.57 | 8.81 | 8.75 | 8.75 |
| $Al_2O_3$ | | 0.00 | 2.72 | | | |
| Total | | 100.00 | 100.00 | 100.00 | 100.00 | 100.00 |

The obtained phosphor was evaluated for the following items.
[Fluorescence Measurement]
(Fluorescence Peak Intensity, Peak Wavelength, and Half-Width)

Fluorescence peak intensity was measured using a fluorescence spectrophotometer (manufactured by Hitachi High-Tech Corporation, F-7000) which had been subjected to correction by Rhodamine B and a secondary standard light source. For the measurement, a solid sample holder attached to the spectrophotometer was used so as to be irradiated with excitation light having the wavelength of 405 nm, thereby obtaining an emission spectrum. Table 2 shows the relative fluorescence peak intensity, the position of the peak wavelength, and the half-width at the peak wavelength when the peak intensity of Comparative Example 1 was set to 100.

(Absorptance)

The absorptance of the obtained phosphor was measured with a spectrophotometer (MCPD-7000 manufactured by Otsuka Electronics Co., Ltd.) and calculated according to the following procedure.

The concave-type cell was filled with the phosphor powder such that the surface thereof was smooth, and an integrating sphere was attached. Monochromatic light separated into the wavelengths of 405 nm, 600 nm, and 700 nm from a light emitting light source was introduced into this integrating sphere using an optical fiber. A sample of the phosphor was irradiated with this monochromatic light as an excitation source to perform the spectrum measurement of the excitation reflected light. At that time, the number of excitation reflected light photons (Qref) was calculated from the spectrum in the wavelength range of −5 nm to +10 nm of the set wavelength.

TABLE 2

| | | Example 1 | Comparative Example 1 | Example 2 | Example 3 | Comparative Example 2 |
|---|---|---|---|---|---|---|
| Fluorescence peak intensity | 405 nm | 130.6 | 100.0 | 118.3 | 129.8 | 91.5 |
| Fluorescence measurement (405 nm) | $\lambda p$ (nm) | 515.4 | 515.0 | 515.2 | 515.0 | 515.4 |
| | FWHM (nm) | 69.4 | 71.6 | 69.2 | 69.4 | 71.6 |
| 405 nm | Abs. | 88.5% | 84.5% | 89.3% | 88.6% | 88.8% |
| | CIEx | 0.254 | 0.250 | 0.249 | 0.249 | 0.259 |
| | CIEy | 0.583 | 0.572 | 0.580 | 0.583 | 0.574 |
| 600 nm | Abs. | 7.0% | 10.5% | 8.9% | 7.3% | 12.7% |
| 700 nm | Abs. | 5.7% | 8.7% | 4.6% | 5.4% | 6.0% |
| Diffuse reflectance (%) | 600 nm | 95.3 | 91.6 | 93.8 | 94.8 | 89.5 |
| | 500 nm | 88.9 | 84.1 | 81.1 | 86.0 | 72.3 |
| Composition (molar ratio) | Ba | 0.0861 | 0.0822 | 0.0816 | 0.0856 | 0.0849 |
| | Li | 0.0325 | 0.0361 | 0.0338 | 0.0325 | 0.0310 |
| | Eu | 0.0046 | 0.0041 | 0.0045 | 0.0045 | 0.0045 |
| | Si | 0.3120 | 0.3114 | 0.3095 | 0.3110 | 0.3143 |
| | Al | 0.0627 | 0.0649 | 0.0618 | 0.0611 | 0.0628 |
| | N | 0.4817 | 0.4666 | 0.4944 | 0.4868 | 0.4811 |
| | O | 0.0204 | 0.0347 | 0.0144 | 0.0186 | 0.0212 |
| Composition analysis | Oxygen amount (wt %) | 1.07 | 1.86 | 0.77 | 0.99 | 1.15 |
| Particle size distribution | D10 (μm) | 7.7 | 5.6 | 8.3 | 7.6 | 7.2 |
| | D50 (μm) | 17.8 | 19.8 | 18.2 | 17.1 | 16.5 |
| | D90 (μm) | 38.5 | 46.7 | 34.2 | 36.0 | 35.7 |
| | Span value (D90-D10)/D50 | 1.73 | 2.08 | 1.42 | 1.66 | 1.73 |
| XRD | Composition (wt %) Li Ba Al Si N | 94.2 | 70.9 | 98.1 | 96.4 | 93.6 |
| | BaAlSi N O | 4.4 | 29.1 | 0.5 | 2.7 | 6.4 |
| | BaSi N | 1.2 | 0.0 | 1.4 | 1.0 | 0.0 |
| | Lattice constant (Å) a | 14.111 | 14.119 | 14.108 | 14.107 | 14.114 |
| | b | 4.910 | 4.912 | 4.911 | 4.911 | 4.906 |
| | c | 8.080 | 8.088 | 8.089 | 8.088 | 8.078 |
| | I2 (2θ = 29.8-30.6°) | 581 | 4146 | 176 | 263 | 4800 |
| | I1 (2θ = 31.1-31.6°) | 24523 | 22308 | 23693 | 28507 | 80455 |
| | I2/I1 | 0.024 | 0.186 | 0.007 | 0.009 | 0.060 |

A standard reflective plate (Spectralon manufactured by Labsphere) having the reflectance of 99% was attached to a sample portion to respectively measure the spectra of excitation light having the wavelengths of 405 nm, 600 nm, and 700 nm. At that time, the number of excitation light photons (Qex) was calculated from the spectrum in the wavelength range of −5 nm to +10 nm of the set wavelength.

The absorptance for the excitation light having each wavelength was calculated by the following formula.

$$\text{Absorptance} = (Qex - Qref)/Qex \times 100$$

[Diffuse Reflectance]

The diffuse reflectance was measured by attaching an integrating sphere device (ISV-722) to an ultraviolet-visible spectrophotometer (V-650) manufactured by JASCO Corporation. Baseline correction was performed with a standard reflective plate (Spectralon), a solid sample holder filled with the phosphor powder was attached, and the diffuse reflectance spectrum in the wavelength range of 220 to 800 nm was measured to read the diffuse reflectance for light having each wavelength of 500 nm and 600 nm.

[Chromaticity]

For a chromaticity x, an x value (chromaticity x) and a y value (chromaticity y) of the CIE chromaticity coordinate in the XYZ color system defined by JIS Z 8781-3:2016 were calculated according to JIS Z 8724:2015 from the wavelength region data in the range from 415 nm to 780 nm of the fluorescence spectrum data obtained by irradiating the phosphor powder sample with monochromatic light dispersed at the wavelength of 405 nm in the above-mentioned method of measuring absorptance.

[Composition Analysis]

The Ba, Li, Al, Si, and Eu contents with respect to the obtained phosphor were measured by an ICP emission spectrophotometer (CIROS-120 manufactured by Rigaku Corporation) after dissolving the powder by an alkali fusion method.

Table 2 shows the molar ratio of each component contained in the phosphor.

In addition, the oxygen content was measured by an oxygen nitrogen analyzer (manufactured by HORIBA, Ltd., EMGA-920).

[Particle Size Distribution Measurement]

The particle size distribution of the powdery phosphor was measured with a particle size distribution analyzer (manufactured by Beckman Coulter, Inc., LC13 320) of the laser diffraction and scattering method. Water was used as a measurement solvent. A small amount of the phosphor powder was injected to an aqueous solution to which 0.05% by weight of sodium hexametaphosphate had been added as a dispersant, and dispersing treatment was performed with a horn-type ultrasound homogenizer (output 300 W, horn diameter 26 mm) to measure the particle size distribution. From the obtained volume frequency particle size distribution curve, the 10 vol % diameter (D10), 50 vol % diameter (D50), and 90 vol % diameter (D90) were determined, and thereby the span value of the particle size distribution ((D90−D10)/D50) was determined from the obtained value.

[Xrd Measurement]

Diffraction patterns of the phosphors of each of the examples and the comparative examples were measured using a powder X-ray diffractometer (product name: Ultima IV, manufactured by Rigaku Corporation) under the following measurement condition.

(Measurement Condition)

X-ray source: Cu-Kα ray ($\lambda$=1.54184 Å)

Output setting: 40 kV·40 mA

Optical conditions during measurement: divergence slit=⅔°

Scattering slit=8 mm

Light-receiving slit=open

Diffraction peak position=2θ (diffraction angle)

Measurement range: 2θ=20° to 70°

Scanning speed: 2 degrees (2θ)/sec, continuous scanning

Scan axis: 2θ/θ

Sample preparation: the powdered phosphor was placed on the sample holder.

The value obtained by performing background correction was defined as the peak intensity.

(Ratio of Crystal Phase)

The phosphors obtained in Examples 1 to 3 were subjected to powder X-ray diffraction measurement (XRD measurement) using Cu-Kα rays, and it was confirmed that in all the examples, the phosphor having the same crystal structure as the crystal represented by $LiBa_2AlSi_7N_{12}$ was obtained as a main product.

After identifying by-products by the same method, the weight ratio of each product was calculated by Rietveld analysis.

(Lattice Constant)

The lattice constant of the crystal represented by $LiBa_2AlSi_7N_{12}$ was obtained by performing Rietveld analysis on the result of X-ray diffraction with a space group of Pnnm.

(Fluorescence Intensity Ratio)

As a result of the XRD diffraction analysis pattern, the peak was observed in the 2θ range of 31.3° to 31.6° and the 2θ range of 29.8° to 30.6° in the phosphors of Examples 1 to 3 and Comparative Examples 1 and 2.

It was confirmed that the maximum peak in the 2θ range of 31.3° to 31.6° corresponded to $LiBa_2AlSi_7N_{12}$, and the maximum peak in the 2θ range of 29.8° to 30.6° corresponded to $BaAlSi_5N_7O_2$.

$I_2/I_1$ was calculated, provided that the peak maximum intensity in the 2θ range of 31.3° to 31.6° was denoted by $I_1$, and the peak maximum intensity in the diffraction angle 2θ range of 29.8° to 30.6° was denoted by 12.

It was found that the phosphors of Examples 1 to 3 had excellent luminescence characteristics because they showed the result of higher fluorescence intensity than those of Comparative Examples 1 and 2.

This application claims priority based on Japanese Patent Application No. 2020-115728 filed on Jul. 3, 2020, Japanese Patent Application No. 2020-115729 filed on Jul. 3, 2020, and Japanese Patent Application No. 2020-115732 filed on Jul. 3, 2020, and the entire disclosures thereof are incorporated herein.

The invention claimed is:

1. A phosphor comprising
an inorganic compound in which Eu as an activator is solid-soluted in an inorganic crystal having a crystal represented by $LiBa_2AlSi_7N_{12}$ or the same crystal structure as the crystal represented by $LiBa_2AlSi_7N_{12}$,
wherein in an X-ray diffraction pattern of the phosphor measured using a Cu-Kα ray, $I_1$ and $I_2$ satisfy $0<I_2/I_1 \leq 0.050$ when a peak maximum intensity of a peak which is present at a position where a diffraction angle 2θ is in a range of 31.3° or more and 31.6° or less is $I_1$, and a peak maximum intensity of a peak which is present at a position where a diffraction angle 2θ is in a range of 29.8° or more and 30.6° or less is $I_2$, and
wherein an oxygen amount in the phosphor is equal to or less than 1.1% by weight.

2. The phosphor according to claim 1,
wherein a diffuse reflectance for light having a wavelength of 600 nm is equal to or more than 92.0%.

3. The phosphor according to claim 1,
wherein a diffuse reflectance for light having a wavelength of 500 nm is equal to or more than 80.0%.

4. The phosphor according to claim 1,
wherein a y value of color purity of an emission color satisfies $0.575 \leq y \leq 0.590$ in a CIE-xy chromaticity diagram when the phosphor is irradiated with excitation light having a wavelength of 405 nm.

5. The phosphor according to claim 1,
wherein an x value of color purity of an emission color satisfies 0.240≤x≤0.260 in a CIE-xy chromaticity diagram when the phosphor is irradiated with excitation light having a wavelength of 405 nm.

6. The phosphor according to claim 1,
wherein D50 is equal to or more than 1 μm and equal to or less than 30 μm when a particle size at which a cumulative value is 50% is D50 in a volume frequency particle size distribution of the phosphor measured by a laser diffraction scattering method.

7. The phosphor according to claim 6,
wherein in the volume frequency particle size distribution of the phosphor measured by the laser diffraction scattering method, ((D90−D10)/D50) is equal to or more than 1.00 and equal to or less than 5.00 when a particle size at which a cumulative value is 10% is D10, and a particle size at which a cumulative value is 90% is D90.

8. The phosphor according to claim 1,
wherein a peak wavelength is in a range of 500 nm or more and 530 nm or less, and a half-width is equal to or more than 50 nm and equal to or less than 80 nm in an emission spectrum obtained when the phosphor is irradiated with excitation light having a wavelength of 405 nm.

9. The phosphor according to claim 1,
wherein an absorptance for light having a wavelength of 405 nm is equal to or more than 75%.

10. The phosphor according to claim 1,
wherein an absorptance for light having a wavelength of 600 nm is equal to or less than 10.0%.

11. The phosphor according to claim 1,
wherein an absorptance for light having a wavelength of 700 nm is equal to or less than 7.0%.

12. The phosphor according to claim 1,
wherein the phosphor is represented by Composition Formula $Ba_aLi_bEu_cSi_dAl_eN_xO_y$ and is represented by a composition in a range in which composition ratios a, b, c, d, e, x, and y in the formula satisfy the following conditions, $$a+b+c+d+e+x+y=1,$$

$$0.05 \le a \le 0.1,$$

$$0.025 \le b \le 0.08,$$

$$0.00001 \le c \le 0.05,$$

$$0.2 \le d \le 0.4,$$

$$0.03 \le e \le 0.1,$$

$$0.45 \le x \le 0.6, \text{ and}$$

$$0.002 \le y \le 0.03.$$

13. The phosphor according to claim 1,
wherein the $LiBa_2AlSi_7N_{12}$-based crystal is an orthorhombic crystal and has symmetry of a space group Pnnm, and
lattice constants a, b, and c are values in the following ranges, $$a=1.409\pm0.05 \text{ nm},$$

$$b=0.489\pm0.05 \text{ nm, and}$$

$$c=0.806\pm0.05 \text{ nm}.$$

14. A wavelength conversion body comprising
the phosphor according to claim 1.

15. A light emitting device comprising
the wavelength conversion body according to claim 14.

* * * * *